(12) United States Patent
Chin et al.

(10) Patent No.: US 7,215,544 B2
(45) Date of Patent: May 8, 2007

(54) APPARATUS FOR ENHANCING HEAT TRANSFER EFFICIENCY OF ENDOTHERMIC/EXOTHERMIC ARTICLE

(75) Inventors: Sim Won Chin, Gwangmyeong-si (KR); Dong Su Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 233 days.

(21) Appl. No.: 10/914,103

(22) Filed: Aug. 10, 2004

(65) Prior Publication Data
US 2005/0243515 A1 Nov. 3, 2005

(30) Foreign Application Priority Data
Apr. 30, 2004 (KR) ............ 10-2004-0030366

(51) Int. Cl.
*H05K 7/20* (2006.01)
*F28F 7/00* (2006.01)

(52) U.S. Cl. ............ 361/697; 165/80.3; 165/185; 361/695; 361/710

(58) Field of Classification Search ............ None
See application file for complete search history.

(56) References Cited

U.S. PATENT DOCUMENTS 4,233,645 A 11/1980 Balderes et al.
6,411,508 B1 * 6/2002 Kang et al. ............ 361/695
6,958,912 B2 * 10/2005 Pokharna et al. ............ 361/700
2001/0045270 A1 11/2001 Bhatti et al.
2002/0027806 A1 3/2002 Quader et al.
2002/0108743 A1 * 8/2002 Wirtz ............ 165/185

FOREIGN PATENT DOCUMENTS

DE 0244805 4/2004
EP 0559092 9/1993
EP 1263040 4/2002

* cited by examiner

*Primary Examiner*—Greg Thompson
(74) *Attorney, Agent, or Firm*—Greenblum & Bernstein, P.L.C.

(57) ABSTRACT

An apparatus for enhancing heat transfer efficiency of an endothermic/exothermic article includes a heat sink disposed on the endothermic/exothermic article to enhance heat transmission, a plurality of fins formed on the heat sink to enhance heat exchange, and a porous medium disposed on the fins to increase cooling efficiency of the endothermic/exothermic article by air flowing between gaps between the fins and the porous medium.

14 Claims, 5 Drawing Sheets

APPARATUS FOR ENHANCING HEAT TRANSFER EFFICIENCY OF ENDOTHERMIC/EXOTHERMIC ARTICLE

BACKGROUND OF THE INVENTION

1. Field of the Invention

The present invention relates to an apparatus for enhancing thermal transmission efficiency of an endothermic/exothermic article, and more particularly, to an apparatus that can enhance heat transfer efficiency of an endothermic/exothermic article, which can absorb or generate heat during its operation, such as a semiconductor integrated circuit and a heat exchanger.

2. Description of the Related Art

Generally, an electronic integrated circuit is formed by mounting a plurality of circuit devices such as a resistor, a transistor, a diode, and a condenser in a small chip to realize the miniaturization and the reliable operation. However, due to the integration of the circuit devices in the small chip, the electronic integrated circuit emits superheat that may be cause the deterioration of the performance of the circuit.

Meanwhile, a heat exchanger is installed in an indoor or outdoor unit of an air conditioning system to absorb or transmit heat from or to a refrigerant. When the heat exchanger is operated, a thermal transmission is realized between an outer circumference of the heat exchanger and outer air. A performance of the heat exchanger is determined according to how quickly the transmission is realized.

According to the prior art, to enhance the heat transfer efficiency of the endothermic/exothermic article, a heat sink is mounted on the source to heat-exchange with the source so that the heat can be transmitted from the heat sink to outer air. However, even when the heat sink is mounted on the endothermic/exothermic article, there is a limitation in properly controlling the temperature of the source. Therefore, a size of the heat sink and/or the endothermic/exothermic article should be increased or the wind velocity or amount should be increased.

However, the size increase of the heat sink and/or the endothermic/exothermic article is increased causes the size increase of a product where the source is applied, deteriorating the customer's preference. In addition, in order to increase the wind velocity or wind amount is increased, a size of a fan should be increased, causing the increase of the product size and power consumption.

That is, the enhancement of the heat transfer efficiency of the endothermic/exothermic article with the heat sink is affected by many limitations such as a space limitation, a structural limitation and the like.

SUMMARY OF THE INVENTION

Accordingly, the present invention is directed to an apparatus for enhancing thermal transmission efficiency of an endothermic/exothermic article, which substantially obviates one or more problems due to limitations and disadvantages of the related art.

An object of the present invention is to provide an apparatus for enhancing thermal transmission efficiency of an endothermic/exothermic article, which can sufficiently transmit heat in a limited space.

Another object of the present invention is to provide an apparatus for enhancing thermal transmission efficiency of an endothermic/exothermic article, which can effectively transmit heat by adding a single pad without mounting a large-sized additional element.

Still another object of the present invention is to provide an apparatus for enhancing heat transfer efficiency of an endothermic/exothermic article, which is particularly suitable for a semiconductor integrated circuit and a heat exchanger of an air conditioning system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an apparatus for enhancing heat transfer efficiency of an endothermic/exothermic article, the apparatus including: a heat sink disposed on the endothermic/exothermic article to enhance heat transmission; a plurality of fins formed on the heat sink to enhance heat exchange; and a porous medium disposed on the fins to increase cooling efficiency of the endothermic/exothermic article by air flowing between gaps between the fins and the porous medium.

In another aspect of the present invention, there is provided an apparatus for enhancing heat transfer efficiency of an endothermic/exothermic article, the apparatus including: an endothermic/exothermic article; a porous medium contacting the endothermic/exothermic article to transmit heat to each other, air being directed to the endothermic/exothermic article through porosities formed in the porous medium to enhance cooling efficiency of the endothermic/exothermic article.

In still another aspect of the present invention, there is provided an apparatus for enhancing heat transfer efficiency of an endothermic/exothermic article, the apparatus including: a porous medium disposed on the endothermic/exothermic article to perform quick heat exchange; and a fan disposed on the porous medium for forcedly generating air current.

According to the present invention, the heat transfer efficiency can be effectively improved for the endothermic/exothermic article in a limited space.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

First Embodiment

Figure 1:
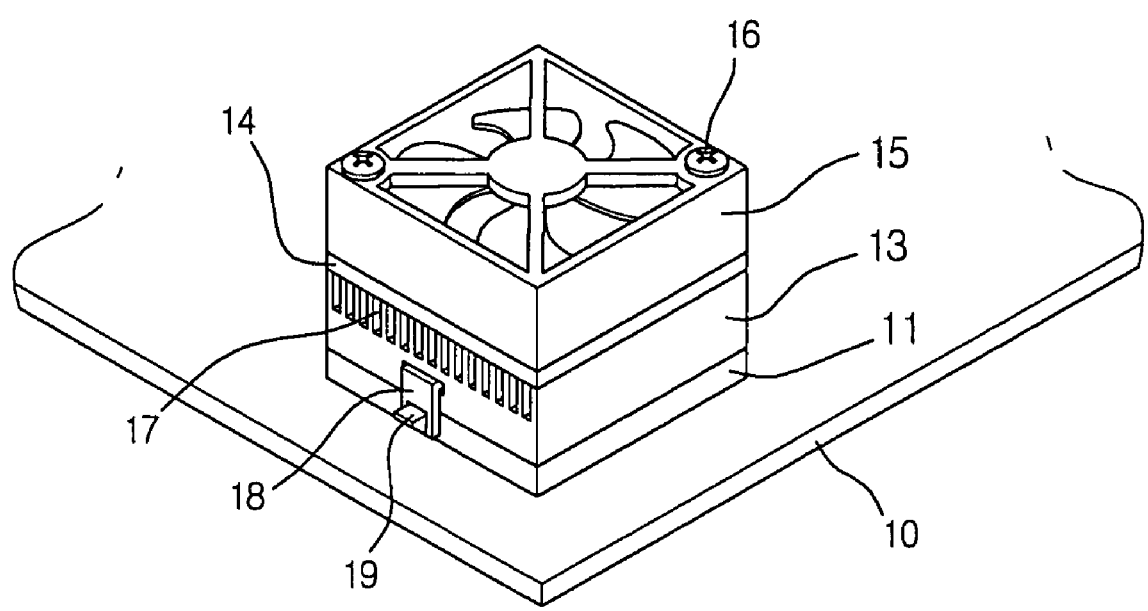
FIG. 1 is a perspective view of a cooling apparatus for an exothermic article according to a first embodiment of the present invention.
Figure 2:
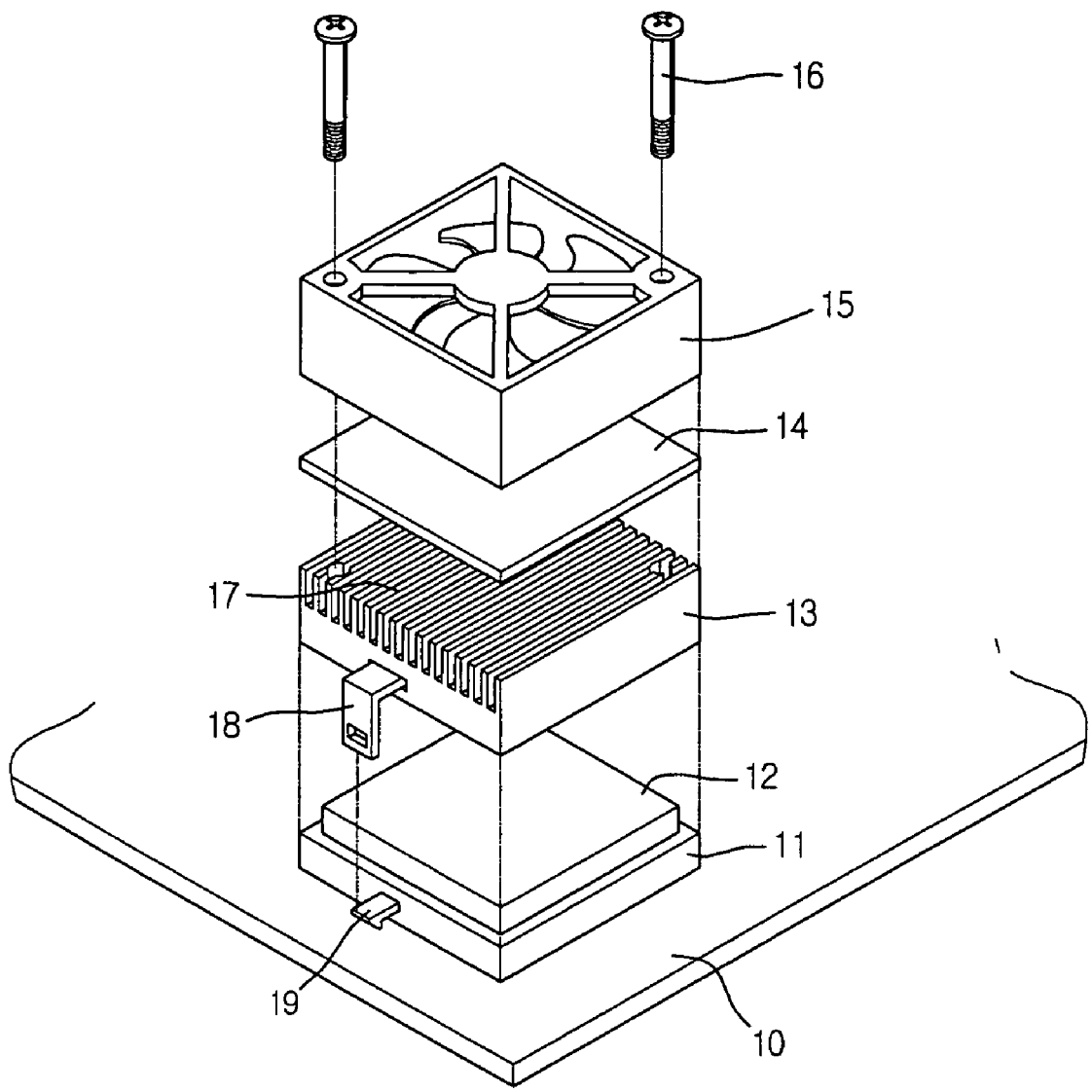
FIG. 2 is an exploded perspective view of a cooling apparatus depicted in FIG. 1.

FIGS. 1 and 2 show a cooling apparatus for an exothermic article according to a first embodiment of the present invention.

Referring first to FIG. 1, a cooling apparatus comprises a housing 11 disposed on a portion of a circuit board 10, a heat sink 13 disposed on the housing 11 to dissipate heat generated from an integrated circuit 12 (see FIG. 2), a cooling fan 15 disposed on the heat sink 13 to allow air to forcedly flow into or out of the heat sink 13, and a porous medium interposed between the heat sink 13 and the cooling fan 15 to enhance cooling efficiency.

The porous medium 14 is designed to quickly absorb the heat from the heat sink 13, thereby enhancing a heat-emission performance. In addition, since outer air freely comes in and out through the porosities, the cooling efficiency of the porous medium 14 can be improved by the air introduced or exhausted by the cooling fan 15.

To further enhance the heat-emission efficiency, a plurality of cooling fins 17 is formed on the heat sink 13 and a hook block 18 is formed on an outer sidewall of the heat sink 13. In addition, a hook projection 19 is formed on an outer sidewall of the housing to be engaged with the hook block 18, thereby securely fixing the heat sink 13 on the integrated circuit.

Referring to FIG. 2, the integrated circuit 12 is provided with a plurality of pins (not shown) fitted in the housing 11. The cooling fins 17 are formed on a top surface of the heat sink 13 to enhance the cooling efficiency of the heat sink by airflow.

The porous medium 14 has an area identical or slight less than that of the top surface of the heat sink 13 and a 1–10 mm thickness, being disposed between a surface defined by tops of the cooling fins 17 and the cooling fan 15. Accordingly, air forcedly formed by the cooling fan 15 is exhausted to an exterior side through porosities of the porous medium 14 and gaps defined between the cooling fins 17, thereby improving the cooling efficiency of the exothermic article (the integrated circuit 12). In addition, the heat of the cooling fins 17 can be quickly transmitted to the porous medium 14 to improve the cooling performance of the heat sink 13, thereby further enhancing the cooling efficiency of the exothermic article.

The airflow direction is determined in accordance with the rotational direction of the cooling fan 15. That is, the air can be forced by the cooling fan 15 toward the porous medium 14. The air may be introduced through the gaps between the cooling fins 17 and is then exhausted by the cooling fan 15 after flowing through the porosities of the porous medium 14.

The operation of the cooling apparatus will be described hereinafter.

The heat generated from the exothermic article such as the integrated circuit 12 is transmitted to the heat sink 13. A portion of the heat transmitted to the heat sink 13 is transmitted to the porous medium 14 to realize a convection current cooling operation. At this point, by the forced-air-current formed by the cooling fan 15, the convection current cooling efficiency is further enhanced, thereby more quickly performing the cooling operation.

Particularly, since the porous medium 14 surface-contacts the cooling fins 17, the airflow through the porosities of the porous medium 14 is extended to the gaps between the cooling fins 17, thereby further enhancing the cooling efficiency. Since the air forcedly comes in and out through the porosities of the porous medium 14 by the cooling fan 15, the convection current cooling efficiency can be further enhanced. That is, since turbulence is enhanced by the plurality of porosities, the convection current cooling efficiency can be further increased.

In addition, since the porous medium 14 functions to absorb heat from the heat sink 13, the cooling efficiency of the exothermic article is further improved.

Figure 3:
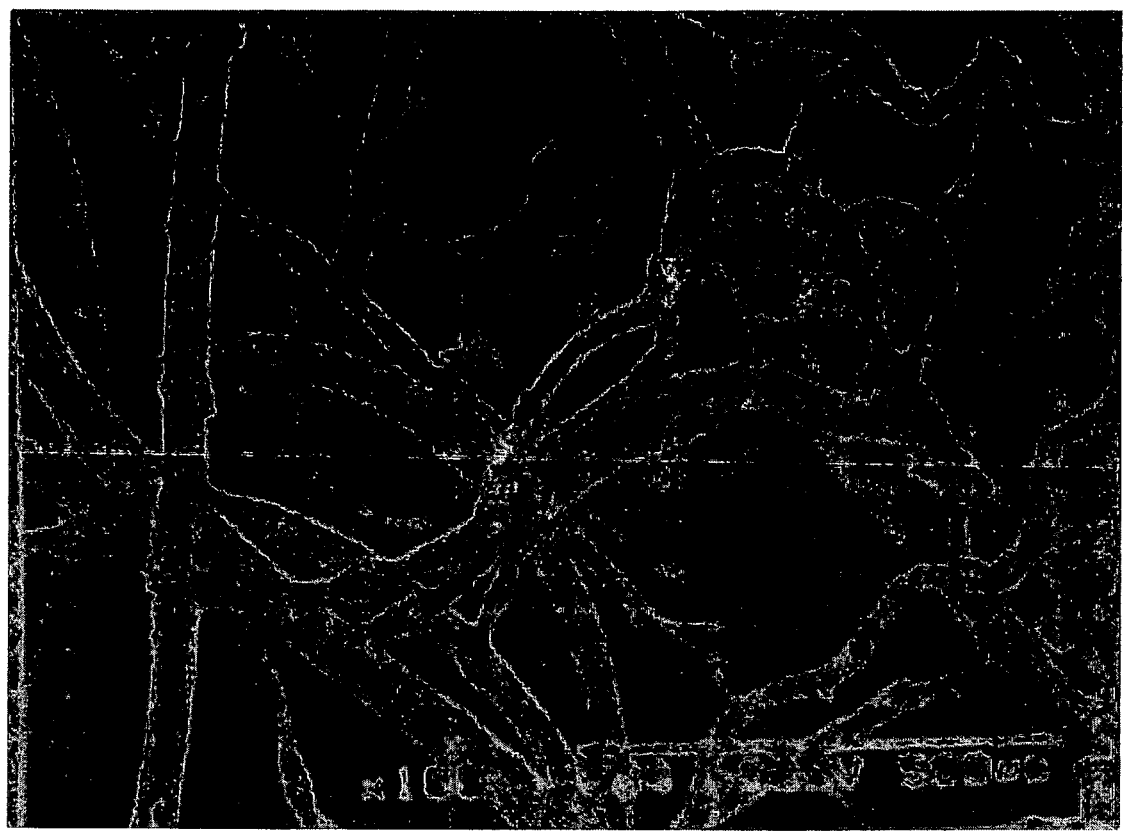
FIG. 3 is a view illustrating an internal structure of a porous medium according to the present invention.

FIG. 3 shows an internal structure of the porous medium according to the present invention.

Referring to FIG. 3, the porous medium 14 is formed through a special process such as a foaming process using metal such as Al such that a plurality of porosities can be formed therein. A size of each porosity is in "µm" range. The porous medium has a physical property having a lightweight and a superior thermal transmission. In recent years, a porous medium formed of graphite has been proposed. This porous medium may be applied to the present invention.

Figure 4:
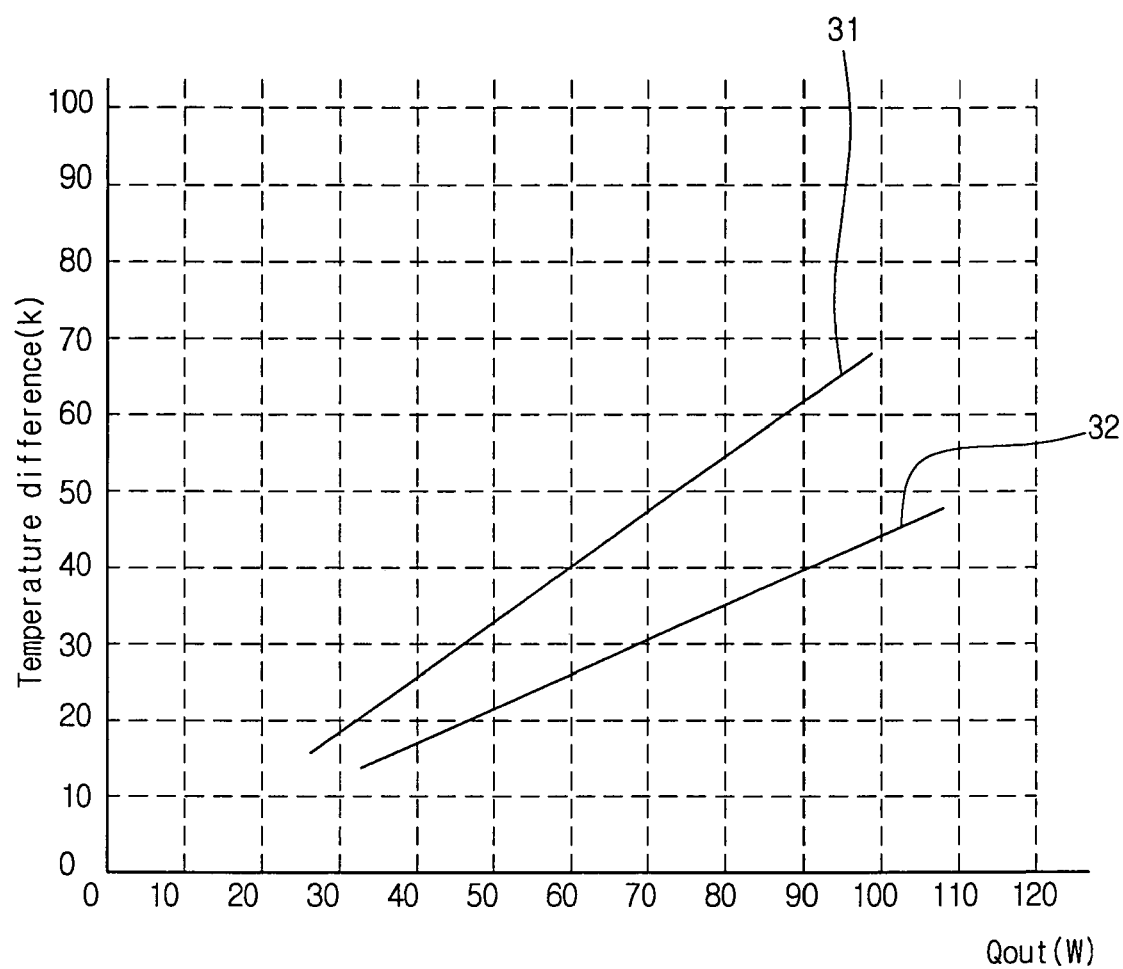
FIG. 4 is a graph illustrating an effect of the present invention.

FIG. 4 shows a graph illustrating an effect of the present invention.

The graph shows an effect of the present invention according to whether the porous medium is employed or not in a state where all of other conditions such as a specification of the exothermic article, a size of the heat sink, the number of cooling fins, and a capacity of the cooling fan are identical.

Referring to FIG. 4, an X-axis indicates an amount of heat generation Qout (Watt) and a Y-axis indicates a difference between a temperature (T) of the exothermic article and a temperature of outer air. In the graph, a first diagram line 31 shows a test result conducted in a case where the porous medium is not employed and a second diagram line 32 shows a test result conducted in a case where the porous medium is employed.

As shown in the graph, a gradient of the first diagram line 31 is greater than that of the second diagram line 32. Since thermal resistance of the first diagram line 31 is greater than that of the second diagram line 32, the cooling efficiency of the first diagram line 31 becomes less than that of the second diagram line 32. That is, the thermal resistance in the case of the first diagram line 31 is 0.66 K/W while the thermal resistance in the case of the second diagram line 32 is 0.47 K/W. This shows that when the porous medium is applied, the heat transfer efficiency is improved by about 30%.

Even when the porous medium 14 is applied, since there is no flow resistance due to the porosities formed therein, no power consumption of the cooling fan is increased.

To increase the cooling efficiency of the case where the porous medium is not applied (the first diagram line 31) as much as the case where the porous medium is applied, a capacity of the cooling fan should be used or a size of the heat sink should be enlarged, causing the increase of the manufacturing costs and power consumption.

In the above description, although an example where the cooling fan is used is described, if required, the cooling fan can be omitted. In this case, since the turbulence is generated by the porous medium, the cooling efficiency is increased as compared with the case where only the heat sink is used.

In addition, the heat sink 13 may be omitted, but the porous medium 14 can be directly disposed contacting a surface of the heat source (the integrated circuit 12). In this case, the cooling operation is sufficiently realized as the air can sufficiently passes through the porosities formed in the porous medium.

The effect of the present invention can be identically obtained even when a heat absorption source is used rather than the exothermic article such as the integrated circuit 12.

For example, when the porous medium is applied to a heat exchanger that functions to absorb heat in an indoor unit of an air conditioning system, the heat absorption performance of the heat exchanger can be improved. That is, when the porous medium 14 is applied to a surface of the normal heat exchanger composed of a cooling tube and a plurality of fins, the heat absorption efficiency of the heat exchanger can be further enhanced. That is, heat transfer efficiency from outer air into the heat exchanger can be improved.

Second Embodiment

A cooling apparatus according to this embodiment is identical to that of the first embodiment except that means for enhancing a contacting rate of the porous medium 14 on the heat sink 13.

That is, in the first embodiment, the porous medium 14 is simply disposed between the heat sink 13 and the cooling fan 15 to allow the heat to be transmitted from the heat sink 13 to the porous medium 14. However, a surface of the high thermal transmitting metal cannot completely contact a surface of another metal. That is, an actual contacting area between the surfaces of the metals is no more than 10% of an entire contactable area, deteriorating the heat transfer efficiency. Therefore, the second embodiment is provided to propose means for enhancing the contacting rate between the heat sink 13 and the porous medium 14, thereby further enhancing the cooling efficiency.

As a first example for enhancing the contacting rate, the porous medium 14 is pressed toward the heat sink 13 using flexibility of the porous medium 14.

As a second example, a soldering process is performed between contacting surfaces of the porous medium 14 and the heat sink 13 using lead and tartar, thereby enhancing the contacting rate. In this case, since the superheat of the heat sink 13 is transmitted to the porous medium 14 via the soldering portion, the heat transfer efficiency can be further improved.

As a third example, a lead alloy containing brass, silver, albata, or aluminum is brazed to increase the contacting rate. In this case, as in the second example, the heat transfer efficiency and the cooling efficiency can be improved.

Figure 5:
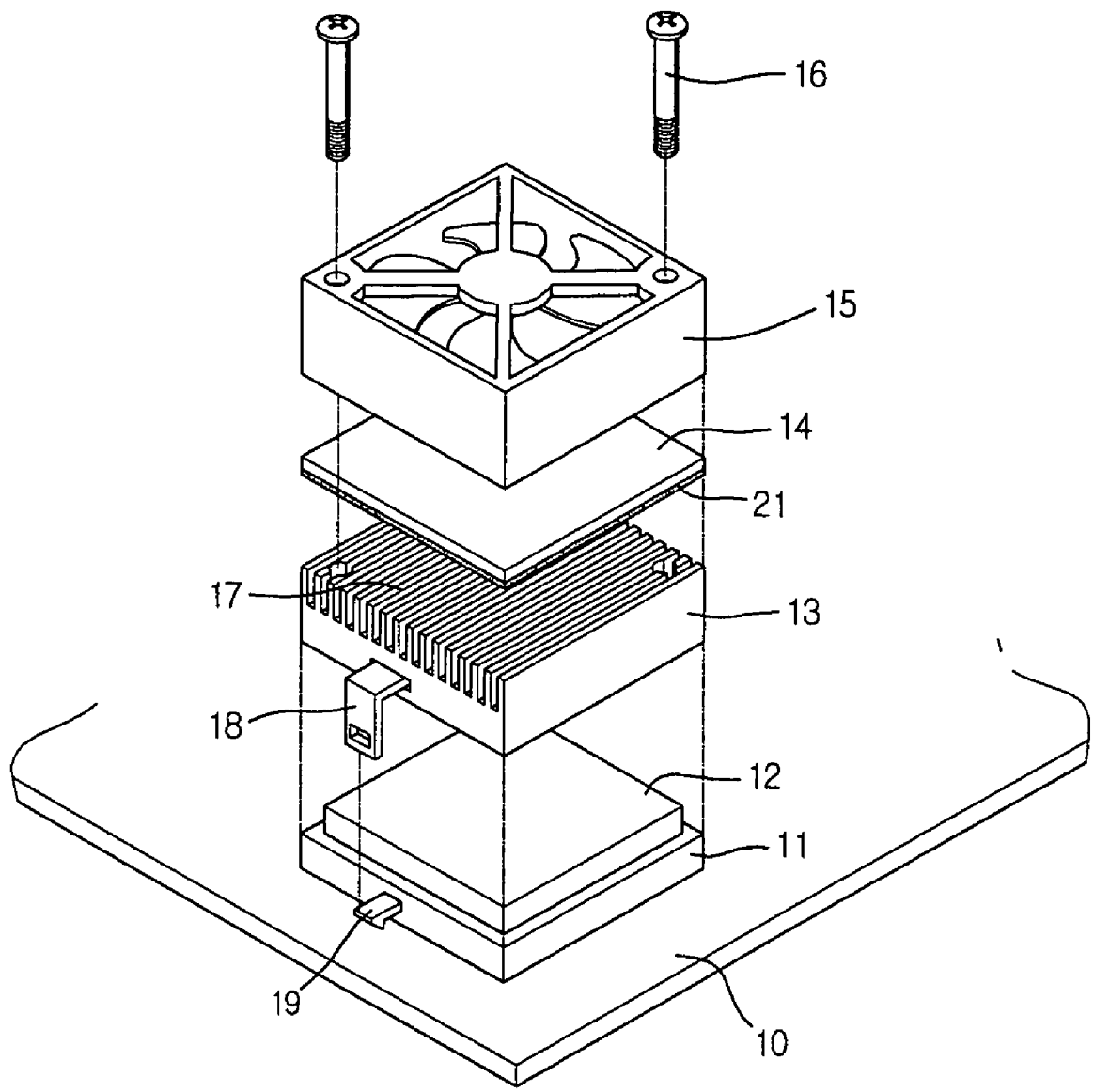
FIG. 5 is an exploded perspective view of a cooling-device for an exothermic article according to a second embodiment of the present invention.

In a third example, thermal compound or thermal conductivity grease 21 may be deposed between the heat sink and the porous medium as shown in FIG. 5.

By the thermal compound or thermal conductivity grease, the heat generated from the heat sink and the porous medium can be dissipated to the air. Furthermore, the thermal transmission can be quickly realized between the heat sink and the porous medium. That is, the exothermic article can be quickly cooled. Particularly, as the contacting rate between the heat sink and the porous medium is increased, the heat of the heat sink can be quickly transmitted to the porous medium.

As described above, the present invention can be also applied to heat absorption source such as the heat exchanger used in the indoor unit of the air conditioning system. That is, the concept of the present invention can be effectively employed to a device that is designed to absorb heat and transmit cool air.

For example, since the indoor unit is designed to absorb heat and discharge cool air, it is importance that the heat is quickly absorbed. Therefore, when the concept of the present invention is applied to the indoor unit of the air conditioning system, the cooling performance can be enhanced by the porous medium formed on the heat absorption source such as fins.

In addition, the above-described four examples for enhancing the contacting rate can be applied between the porous medium 14 and the integrated circuit 12 in a state where the heat sink 13 is omitted.

According to the present invention, the heat transfer efficiency can be effectively improved for the endothermic/exothermic article in a limited space.

In addition, since the cooling efficiency can be improved by simply adding a single pad, the structure of the product is not complicated.

Since the airflow can be effectively extended from the gaps between the fins to the porosities of the porous medium, the heat transfer efficiency of the porous medium can be further enhanced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An apparatus for enhancing heat transfer efficiency of an endothermic/exothermic article, the apparatus comprising:
   a heat sink disposed on the endothermic/exothermic article to enhance heat transmission;
   a plurality of fins formed on the heat sink to enhance heat exchange; and
   a porous medium having generally planar top and bottom surfaces disposed on the fins to increase cooling efficiency of the endothermic/exothermic article by air flowing between gaps between the fins and the porous medium,
   wherein the porous medium extends generally parallel to a surface of the endothermic/exothermic article, and
   wherein the porous medium is provided on a top surface of the fins.

2. The apparatus according to claim 1, further comprising a cooling fan for directing air to the porous medium.

3. The apparatus according to claim 1, further comprising thermal compound or thermal conductivity grease disposed between the porous medium and the fins.

4. The apparatus according to claim 1, wherein a thickness of the porous medium is in the range of about 1 mm to about 10 mm.

5. The apparatus according to claim 1, wherein the porous medium is bonded on the cooling fins by one of a soldering or a brazing process.

6. The apparatus according to claim 1, wherein the porous medium is pressured to closely contact the cooling fins.

7. The apparatus according to claim 1, wherein the porous medium is formed of aluminum.

8. The apparatus according to claim 1, wherein gaps, defined between sidewalls of adjacent fins and positioned beneath the generally planar bottom surface of the porous medium, communicate with porosities formed in the porous medium.

9. The apparatus according to claim 1, wherein the endothermic/exothermic article is an integrated circuit.

10. The apparatus according to claim 1, wherein the endothermic/exothermic article is a heat exchanger.

11. An apparatus comprising:
an endothermic/exothermic article;
a porous medium communicating with an endothermic/exothermic article to transmit heat to each other, air being directed to the endothermic/exothermic article through porosities formed in the porous medium to enhance cooling efficiency of the endothermic/exothermic article, wherein a thickness of the porous medium is in the range of about 1 mm to about 10 mm, and a heat sink provided with a plurality of cooling fins, wherein the heat sink is disposed between the endothermic/exothermic article and the porous medium, and wherein the porous medium is provided on a top surface of the cooling fins.

12. The apparatus according to claim 11, further comprising a cooling fan for directing air to the porous medium.

13. The apparatus according to claim 11, wherein the endothermic/exothermic article is a heat exchanger.

14. The apparatus according to claim 11, further comprising a thermal compound or a thermal conductivity grease disposed between the porous medium and the endothermic/exothermic article.

* * * * *

UNITED STATES PATENT AND TRADEMARK OFFICE
CERTIFICATE OF CORRECTION

PATENT NO. : 7,215,544 B2 Page 1 of 1
APPLICATION NO. : 10/914103
DATED : May 8, 2007
INVENTOR(S) : S. W. Chin et al.

It is certified that error appears in the above-identified patent and that said Letters Patent is hereby corrected as shown below:

At column 7, line 11 (claim 11, line 9) "," should be -- ; --.

Signed and Sealed this

Twentieth Day of May, 2008

JON W. DUDAS
*Director of the United States Patent and Trademark Office*